United States Patent [19]

Shimizu

[11] Patent Number: 5,204,978
[45] Date of Patent: Apr. 20, 1993

[54] FREQUENCY SETTING METHOD FOR RADIO TRANSMISSION APPARATUS

[75] Inventor: Hiroyuki Shimizu, Tokyo, Japan

[73] Assignee: Nec Corporation, Japan

[21] Appl. No.: 543,216

[22] Filed: Jun. 25, 1990

[30] Foreign Application Priority Data

Jun. 23, 1989 [JP] Japan .................. 1-159617

[51] Int. Cl.$^5$ .............................. H04B 1/40
[52] U.S. Cl. ..................... 455/76; 455/125
[58] Field of Search ............... 455/76, 77, 103, 113, 455/125, 62, 71, 51; 375/1, 40; 380/32, 34

[56] References Cited

U.S. PATENT DOCUMENTS 4,654,859 3/1987 Kung et al. .................. 455/76

Primary Examiner—Reinhard J. Eisenzopf
Assistant Examiner—Christine K. Belzer
Attorney, Agent, or Firm—Ostrolenk, Faber, Gerb & Soffen

[57] ABSTRACT

A frequency setting system for a radio transmission apparatus of the type transmitting a signal in the form of bursts and changing transmission frequency burst by burst. A frequency division data signal representative of a frequency division number and a strobe signal representative of frequency setting are fed to a frequency synthesizer. The timings for generating the frequency division data signal and strobe signal are determined with no regard to the locking time of the frequency synthesizer which is dependent on the kind of the synthesizer, frequency, etc.

7 Claims, 5 Drawing Sheets

FREQUENCY SETTING METHOD FOR RADIO TRANSMISSION APPARATUS

BACKGROUND OF THE INVENTION

The present invention relates to a frequency setting method for a radio transmission apparatus of the type which transmits a signal in bursts and changes the transmission frequency burst by burst.

Radio transmission apparatuses of the type described include one which determines a transmission frequency in response to an output of a frequency synthesizer which is implemented with a PLL (Phase Locked Loop) system. Specifically, the frequency synthesizer changes the frequency of its output by changing a frequency division number. The frequency division number is given as a frequency division data signal which is applied to the frequency synthesizer. A strobe signal is also applied to the frequency synthesizer for determining the frequency division number timing.

The problem with the prior art frequency setting method described above is that the locking time necessary for the frequency synthesizer to lock the phase varies with the kind of the synthesizer, the size of change in frequency between successive bursts, and so forth. It follows that the timings for feeding the frequency division data signal and subsequent strobe signal to the frequency synthesizer have to be controlled in matching relation to a particular configuration of the apparatus.

SUMMARY OF THE INVENTION

It is therefore an object of the present invention to provide a frequency setting method for a radio transmission apparatus which simplifies the control associated with frequency setting.

It is another object of the present invention to provide a generally improved frequency setting method for a radio transmission apparatus.

In accordance with the present invention, a frequency setting method for a radio transmission apparatus which transmits a burst signal by changing transmission frequency burst by burst comprises the steps of generating a frequency division data signal representative of a frequency division number and a strobe signal representative of frequency setting, feeding, immediately after a burst immediately preceding a burst whose frequency should be set by a single strobe, the single strobe, and feeding, immediately after a strobe signal has been fed immediately after a burst two burst ahead of a burst whose frequency should be set by a single frequency division signal had ended, the single frequency division signal.

Also, in accordance with the present invention, a frequency setting method for a radio transmission apparatus which transmits a burst signal by changing transmission frequency burst by burst comprises the steps of generating a frequency division data signal representative of a frequency division number and a strobe signal representative of frequency setting, beginning to feed, immediately after a burst immediately preceding a burst whose frequency should be set by a frequency division data signal has begun, the frequency division data signal, and feeding, immediately after the burst immediately preceding the burst whose frequency should be set by the frequency division data, a strobe signal for the burst whose frequency should be set.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
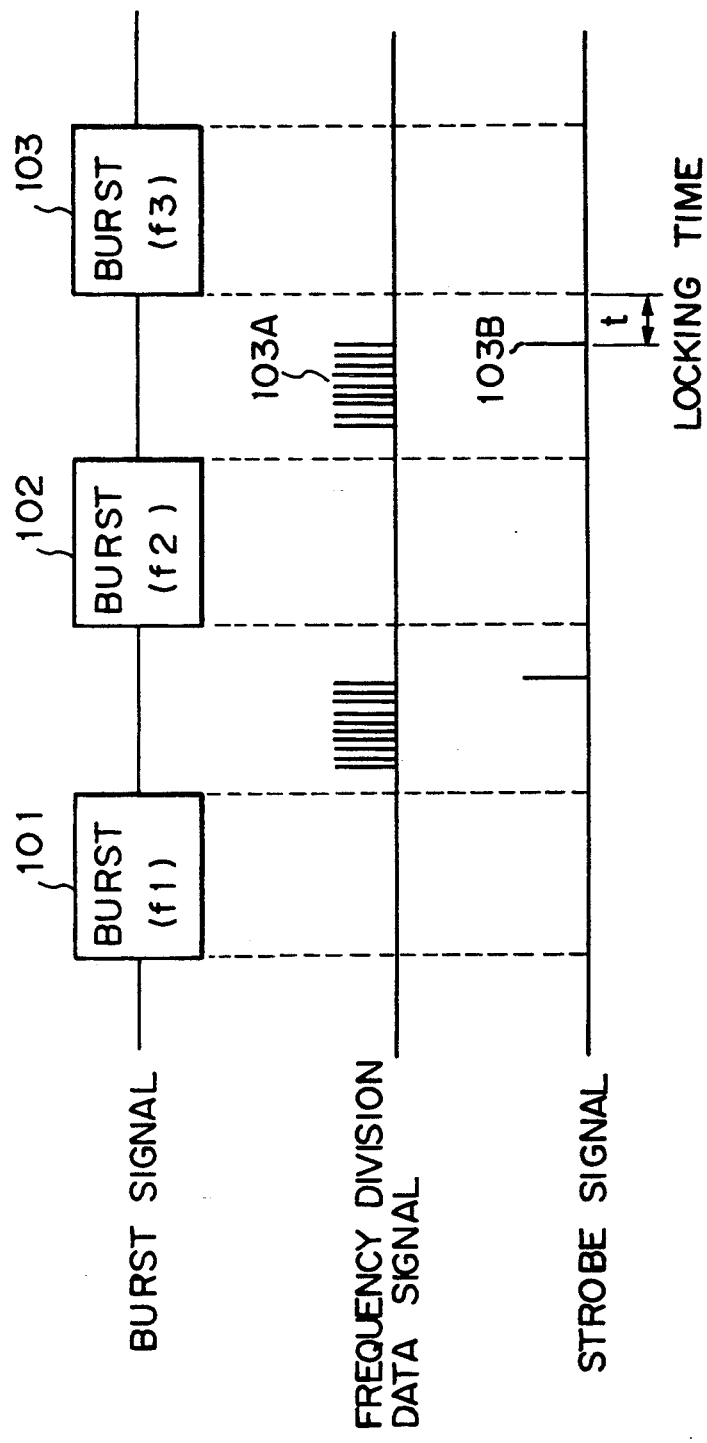
FIG. 1 is a timing chart representative of a prior art frequency setting method for a radio transmission apparatus.

To better understand the present invention, a brief reference will be made to a prior art frequency setting method, shown in FIG. 1. Specifically, FIG. 1 shows a burst signal transmitted from a radio transmission apparatus, and a frequency division data signal and a strobe signal which are applied to the frequency synthesizer. The burst signal is shown as having three bursts 101 to 103 to which are assigned three different frequencies $f_1$, $f_2$ and $f_3$, respectively. Since the frequency differs from one burst to another as mentioned, the frequency is set burst by burst. For the burst 103, for example, the frequency $f_3$ is set by feeding frequency division data 103A included in the frequency division data signal and then supplying a strobe 103B included in the strobe signal. Generally, PLL type frequency synthesizer needs a certain locking time t for locking the phase. Hence, an arrangement is made such that the delivery of frequency division data and strobe to the synthesizer is completed a period of time t before the time when the associated burst begins.

However, the locking time t of the frequency synthesizer depends on the kind of the synthesizer, the size of change in frequency between successive bursts, and so forth, as discussed earlier. This results in the complicated control over the timings of the frequency division data and strobes.

Figure 2:
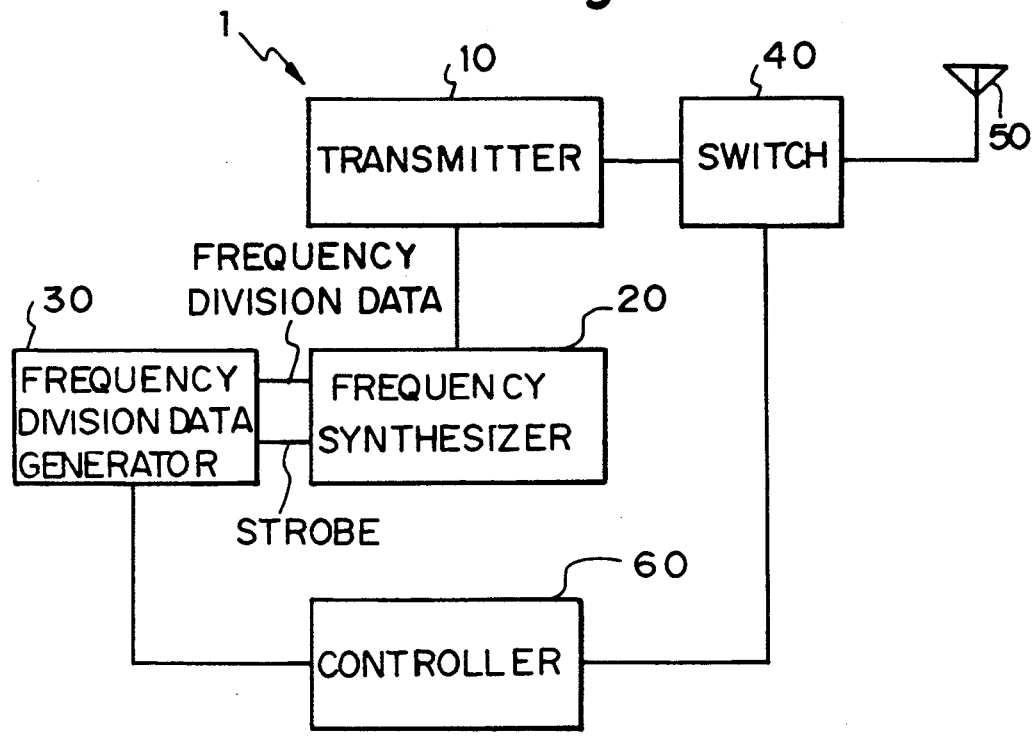
FIG. 2 is a block diagram schematically showing a radio transmission apparatus for practicing preferred embodiments of the present invention.

Referring to FIG. 2, there is shown a radio transmission apparatus to which preferred embodiments of the present invention are applied and which assigns a different frequency to each burst. As shown, the radio transmission apparatus, generally 1, has a transmitter 10 for generating a radio signal, and a PLL type frequency synthesizer 20 for setting a transmission frequency of the transmitter 10. A frequency division data generator 30 feeds to the frequency synthesizer 20 a frequency division data signal and a strobe signal which provides the synthesizer 20 with a frequency division setting timing. A switch 40 switches on and off the output of the transmitter 10 to generate bursts which are delivered to an antenna 50. A controller 60 controls the operation timings of the frequency division data generator 30 and the switch 40.

Figure 3:
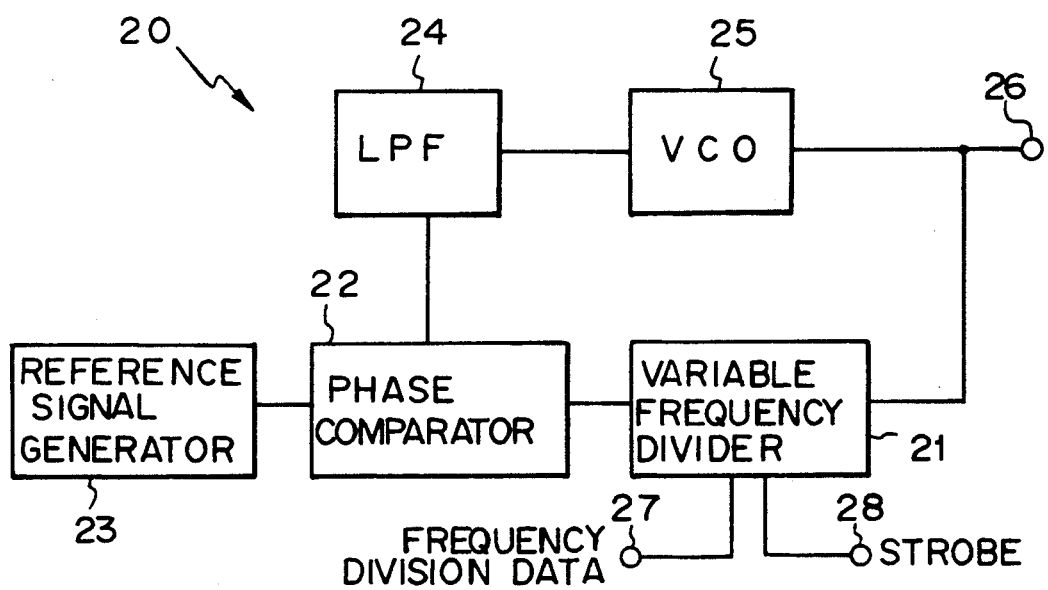
FIG. 3 is a block diagram schematically showing a frequency synthesizer included in the apparatus of FIG. 2.

As shown in FIG. 3, the frequency synthesizer 20 has a variable frequency divider 21, a phase comparator 22, a reference signal oscillator 23, a low pass filter 24, and a VCO (Voltage Controlled Oscillator) 25. The VCO 25 delivers a signal whose frequency is variable to the transmitter 10 via a terminal 26. The variable frequency divider 21 receives the frequency division data from the frequency division data generator 30 via a terminal 27 and the strobe signal via a terminal 28.

Figure 4:
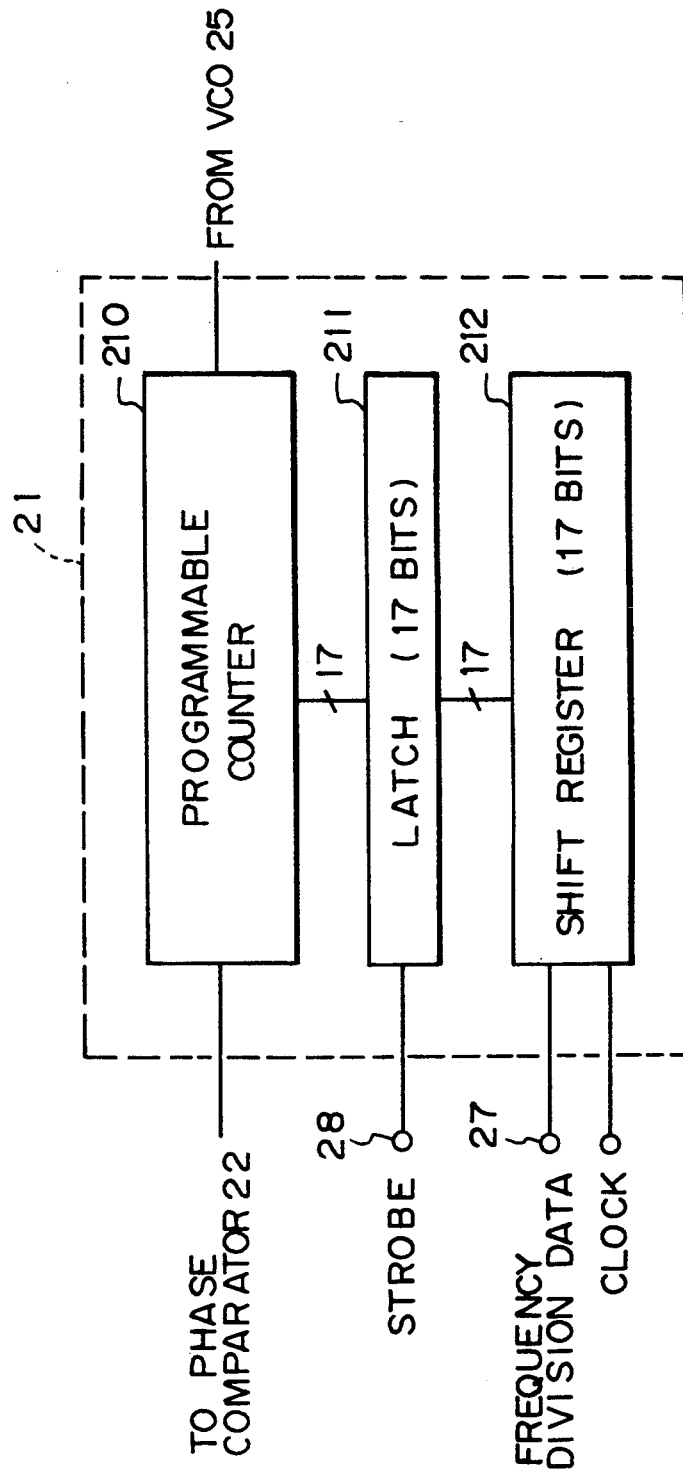
FIG. 4 is a block diagram schematically showing a variable frequency divider included in the frequency synthesizer of FIG. 3.

FIG. 4 shows a specific construction of the variable frequency divider 21. As shown, the variable frequency divider 21 has a programmable counter 210, a latch 211, and a shift register 212. 17-bit frequency data, for example, which is representative of a frequency division number is serially fed to the shift register or 17-bit shift register 212, via the terminal 27. After all 17-bit frequency data has been fed to the shift register 212, a strobe signal is applied to the latch 211 via the terminal 28. The frequency data lodged in the shift register 212 is applied to the programmable counter 210 to have its frequency changed thereby, so that the output frequency of the frequency synthesizer 20 itself is changed. A clock is fed to the shift register 212. In FIG. 3, the clock is not shown because the clock and the frequency division data are usually fed in a pair.

The frequency synthesizer 20 may be implemented by an LSIIC "μPD2833C" available from NEC Corporation, Japan.

Figure 5:
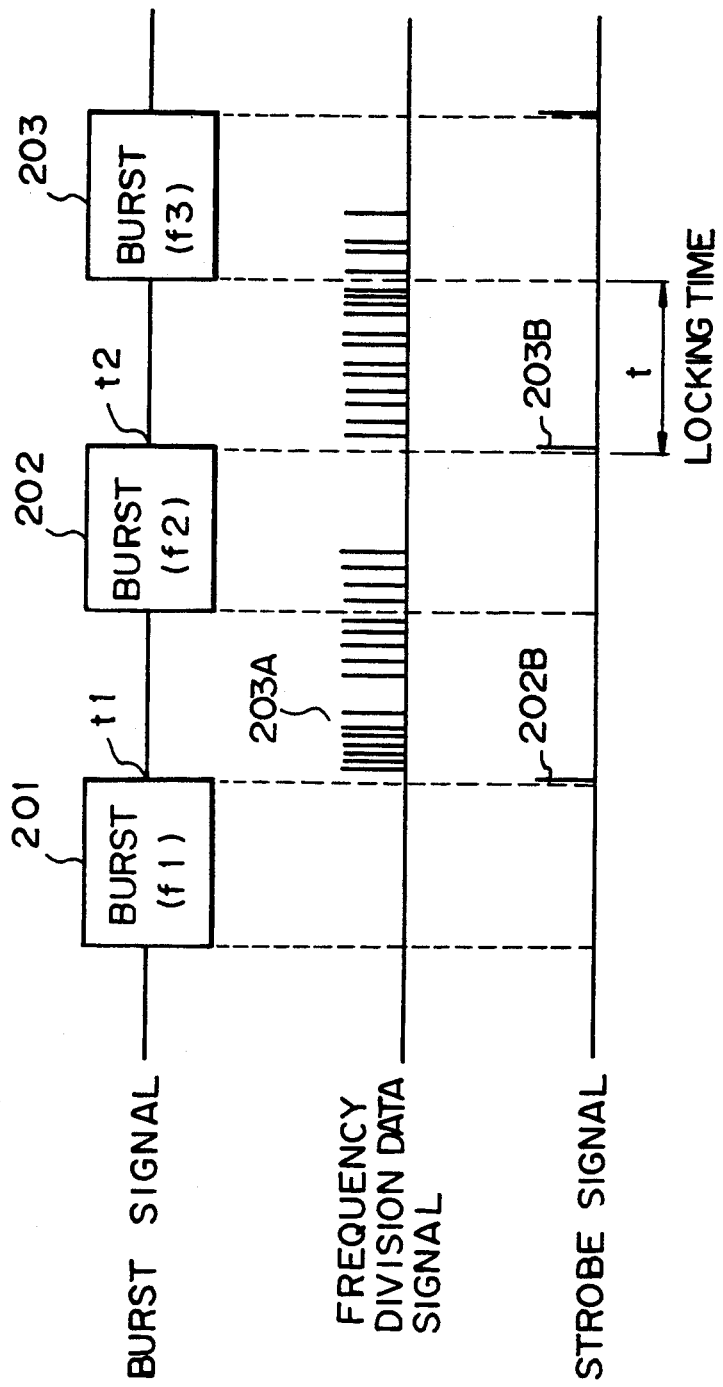
FIG. 5 is a timing chart representative of a preferred embodiment of the present invention.

A preferred embodiment of the present invention practicable with the above construction will be described. FIG. 5 shows timings at which the illustrative embodiment generates a burst signal, a frequency division data signal, and a strobe signal. Let the following description concentrate on a burst 203 included in the burst signal by way of example. The burst 203 has a frequency $f_3$ which is set by a strobe 203B which is included in the strobe signal. As FIG. 5 indicates, the strobe 203B is fed to the frequency synthesizer 20 at a time $t_2$ when the burst 202 immediately preceding the burst 203 has ended, i.e., immediately after the beginning of a non-transmission interval. Further, frequency division data 203A included in the frequency division data signal for setting the frequency of the burst 203 of interest begins to be fed at a time when a burst 201 two bursts ahead of the burst 203 has ended, i.e., immediately after a strobe 202B has been delivered at a time $t_1$ which is just after the beginning of a non-transmission interval. The controller 60, therefore, causes the strobe signal and subsequent frequency division data signal to be fed in synchronism with the timings at which the switch 40 is in an OFF state. In this configuration, while the output of the transmitter 10 is switched on and off by the switch 40, the frequency is set such that the different frequencies $f_1$ to $f_3$ are assigned to the bursts 201 to 203, respectively.

As stated above, the illustrative embodiment determines the operation timings with no regard to the locking time t which is dependent on the kind of a frequency synthesizer, frequency, and so forth, whereby the control is simplified. Moreover, the frequency synthesizer does not need a high-speed clock because the entire non-transmission interval is usable as the locking time t, so that the design is easy and the carrier-to-noise (C/N) ratio is easy to improve.

Further, the interval between successive strobes is fully available for the delivery of the frequency division data, meaning that the signal speed of the frequency data can be lowered. This is successful in reducing the interference between data signals which is apt to occur in the event of interchange of high-speed data, thereby eliminating the need for expensive cables such as shield cables for signal lines. Hence, the apparatus is inexpensive and simple in construction.

Figure 6:
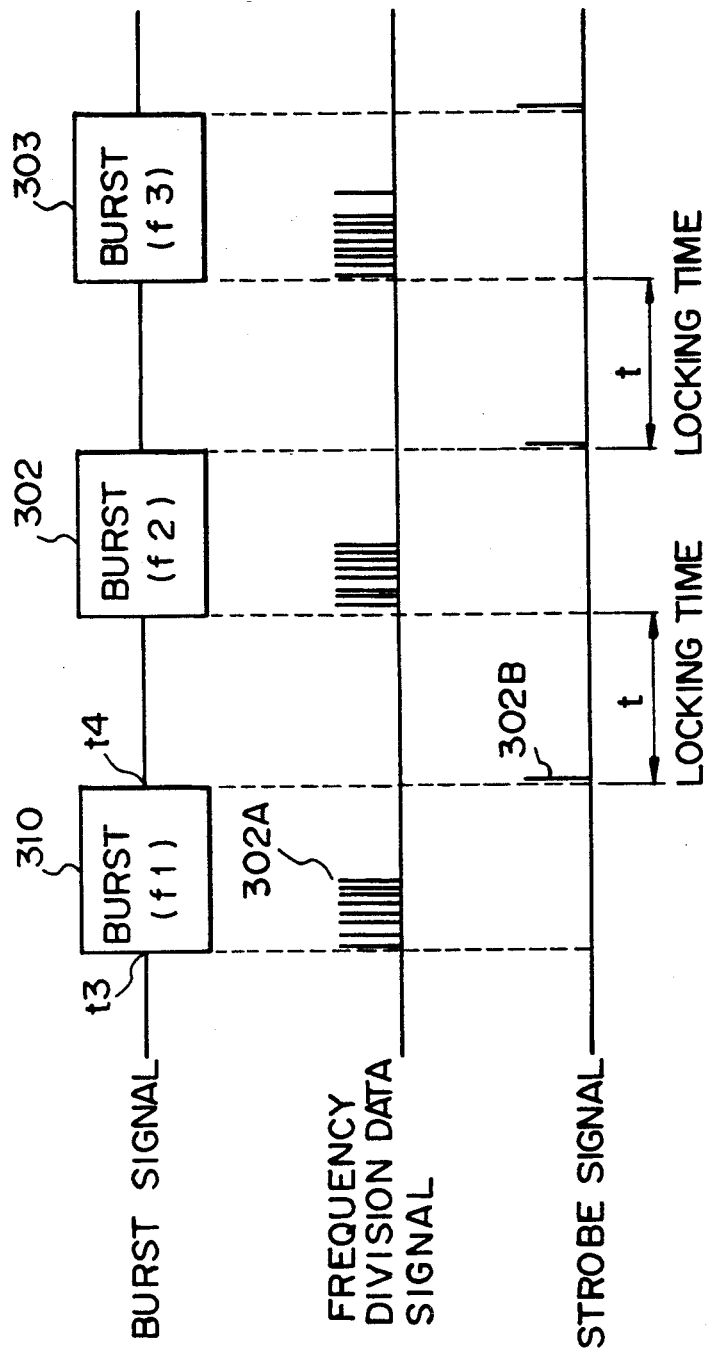
FIG. 6 is a timing chart representative of an alternative embodiment of the present invention.

Referring to FIG. 6, an alternative embodiment of the present invention will be described. The operation timings shown in FIG. 3 are provided by the controller 60, as follows. Assume a burst 302, for example, which is included in a burst signal and has a frequency $f_2$. In this particular embodiment, frequency data 302A included in a frequency division data signal for setting the frequency $f_2$ begins to be fed at a time $t_3$ when a burst 301 immediately preceding the burst 302 has begun. A strobe 302B for setting the frequency $f_2$ is fed at a time when the burst 301 has ended, i.e., at a time $t_4$ which is just after the beginning of the non-transmission interval. The controller 60, therefore, causes the frequency division data signal and strobe signal to be delivered in synchronism with the operation timings of the switch 40. Specifically, while the output of the transmitter 10 is switched on and off by the switch 40, the different frequencies $f_1$ to $f_3$ are assigned to the bursts 301 to 303, respectively.

The advantages attainable with the alternative embodiment shown and described are comparable with those which have been stated in relation to the previous embodiment.

In summary, it will be seen that the present invention provides a frequency setting method which allows the operation timings of a radio transmission apparatus to be determined with no regard to the locking time of a frequency synthesizer which is dependent on the kind of the synthesizer, frequency, etc. The method, therefore, promotes simple control over a radio transmission apparatus.

Various modifications will become possible for those skilled in the art after receiving the teachings of the present disclosure without departing from the scope thereof.

What is claimed is:

1. An apparatus comprising:
   a transmitter means for successively transmitting bursts at predetermined intervals and changing the frequencies of said bursts in response to locally generated frequencies;
   a frequency synthesizer for generating said locally generated frequencies in response to control data; and
   a means for applying a first control datum of said control data to said frequency synthesizer means immediately after a first one of said bursts had begun, said first control datum being used for setting the frequency of a second one of said bursts which follows said first burst.

2. A frequency setting method for a radio transmission apparatus which transmits burst signals of changing transmission frequencies, burst by burst, said burst signals including at least a first, a second, and a third burst signal which follows sequentially, comprising the steps of:
   (a) generating a frequency division data signal comprising a frequency division number and a strobe signal for setting the frequency division number for said third burst signal;
   (b) supplying said strobe signal immediately after the end of said second burst signal; and (c) supplying said frequency division number beginning at about the end of said first burst signal.

3. The frequency setting method of claim 2, further including the step of generating a respective frequency division data signal comprising a respective frequency division number and a respective strobe signal for the other ones of said burst signals, said respective frequency division data signal having a timing similar to the timing of said frequency division number and said strobe signal provided for said third burst signal.

4. The frequency setting method of claim 3, wherein said frequency division number which is supplied beginning at about the end of said first burst signal begins to be supplied immediately after a strobe signal is supplied for said second burst signal.

5. A frequency setting method for a radio transmission apparatus which transmits burst signals of changing transmission frequencies, burst by burst, said burst signals including at least a first, a second, and a third burst signal which follows sequentially, comprising the steps of:
 (a) generating a frequency division data signal comprising a frequency division number and a strobe signal for setting the frequency division number for said third burst signal;
 (b) supplying said strobe signal immediately after the end of said second burst signal; and
 (c) supplying said frequency division number beginning at about the beginning of said second burst signal.

6. The frequency setting method of claim 5, further including the step of generating a respective frequency division data signal comprising a respective frequency division number and a respective strobe signal for the other ones of said burst signals, said respective frequency division data signal having a timing similar to the timing of said frequency division number and said strobe signal provided for said third burst signal.

7. An apparatus, comprising:
 a transmitter means for successively transmitting bursts at predetermined intervals and changing the frequencies of said bursts in response to locally generated frequencies;
 a frequency synthesizer for generating said locally generated frequencies in response to control data; and
 a means for supplying a first control datum of said control data to said frequency synthesizer means immediately after a first one of said bursts had ended and using said first control datum for setting the frequency of a third one of said bursts which follows a second one of said bursts, where said second burst follows said first burst.

* * * * *